United States Patent
Glass et al.

(10) Patent No.: US 9,882,009 B2
(45) Date of Patent: Jan. 30, 2018

(54) HIGH RESISTANCE LAYER FOR III-V CHANNEL DEPOSITED ON GROUP IV SUBSTRATES FOR MOS TRANSISTORS

(71) Applicant: INTEL CORPORATION, Santa Clara, CA (US)

(72) Inventors: Glenn A. Glass, Beaverton, OR (US); Anand S. Murthy, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/906,713

(22) PCT Filed: Aug. 23, 2013

(86) PCT No.: PCT/US2013/056476
§ 371 (c)(1),
(2) Date: Jan. 21, 2016

(87) PCT Pub. No.: WO2015/026371
PCT Pub. Date: Feb. 26, 2015

(65) Prior Publication Data
US 2016/0163802 A1 Jun. 9, 2016

(51) Int. Cl.
*H01L 29/205* (2006.01)
*H01L 21/762* (2006.01)
(Continued)

(52) U.S. Cl.
CPC ...... *H01L 29/205* (2013.01); *H01L 21/30604* (2013.01); *H01L 21/30612* (2013.01);
(Continued)

(58) Field of Classification Search
CPC .............. H01L 29/205; H01L 29/267; H01L 29/66446; H01L 29/6522; H01L 21/76232;
(Continued)

(56) References Cited

U.S. PATENT DOCUMENTS 4,952,527 A    8/1990   Calawa et al.
5,327,006 A *   7/1994   Beasom .............. H01L 29/0821
                                                                        257/519

(Continued)

FOREIGN PATENT DOCUMENTS

EP       0214610 A2    3/1987
EP       2071623 A2    6/2009
(Continued)

OTHER PUBLICATIONS

D.W. Palmer, "Properties of the III-V Compound Semiconductors", Feb. 2006, http://www.semiconductors.co.uk/propiiiv5653.htm.*
(Continued)

*Primary Examiner* — Tom Thomas
*Assistant Examiner* — Vincent Wall
(74) *Attorney, Agent, or Firm* — Finch & Maloney PLLC

(57) ABSTRACT

Techniques are disclosed for using a high resistance layer between a III-V channel layer and a group IV substrate for semiconducting devices, such as metal-oxide-semiconductor (MOS) transistors. The high resistance layer can be used to minimize (or eliminate) current flow from source to drain that follows a path other than directly through the channel. In some cases, the high resistance layer may be a III-V wide bandgap layer. In some such cases, the wide bandgap layer may have a bandgap greater than 1.4 electron volts (eV), and may even have a bandgap greater than 2.0 eV. In other cases, the wide bandgap layer may be partially or completely converted to an insulator through oxidation or nitridation, for example. The resulting structures may be used with planar, finned, or nanowire/nanoribbon transistor architectures to help prevent substrate leakage problems.

19 Claims, 10 Drawing Sheets

(51) Int. Cl.

| | |
|---|---|
| *H01L 21/76* | (2006.01) |
| *H01L 29/165* | (2006.01) |
| *H01L 29/06* | (2006.01) |
| *H01L 29/78* | (2006.01) |
| *H01L 27/02* | (2006.01) |
| *H01L 29/267* | (2006.01) |
| *H01L 29/10* | (2006.01) |
| *H01L 29/66* | (2006.01) |
| *H01L 21/306* | (2006.01) |
| *H01L 21/02* | (2006.01) |

(52) U.S. Cl.
CPC .... *H01L 21/7605* (2013.01); *H01L 21/76224* (2013.01); *H01L 21/76232* (2013.01); *H01L 21/76264* (2013.01); *H01L 27/0255* (2013.01); *H01L 29/0653* (2013.01); *H01L 29/1033* (2013.01); *H01L 29/1054* (2013.01); *H01L 29/1079* (2013.01); *H01L 29/1083* (2013.01); *H01L 29/165* (2013.01); *H01L 29/267* (2013.01); *H01L 29/66522* (2013.01); *H01L 29/66795* (2013.01); *H01L 29/78* (2013.01); *H01L 29/785* (2013.01); *H01L 29/7848* (2013.01); *H01L 21/0262* (2013.01); *H01L 21/02241* (2013.01); *H01L 21/02247* (2013.01); *H01L 21/02373* (2013.01); *H01L 21/02461* (2013.01); *H01L 21/02463* (2013.01); *H01L 21/02466* (2013.01); *H01L 21/02546* (2013.01); *H01L 21/02549* (2013.01); *H01L 29/0673* (2013.01)

(58) Field of Classification Search
CPC ....... H01L 21/30612; H01L 21/823431; H01L 29/1037; H01L 29/66795; H01L 29/785; H01L 29/7853; H01L 29/66462; H01L 29/7781; H01L 21/7605; H01L 21/823481; H01L 21/823878

See application file for complete search history.

(56) References Cited

U.S. PATENT DOCUMENTS

| | | | |
|---|---|---|---|
| 5,844,303 A | 12/1998 | Kikkawa et al. | |
| 6,144,060 A | 11/2000 | Park et al. | |
| 6,469,315 B1* | 10/2002 | Suzuki | H01L 29/772 257/192 |
| 6,703,638 B2 | 3/2004 | Danzilio | |
| 6,876,053 B1* | 4/2005 | Ma | H01L 21/76224 257/369 |
| 7,425,751 B2 | 9/2008 | Balasubramanian et al. | |
| 7,459,731 B2 | 12/2008 | Xie et al. | |
| 7,504,704 B2* | 3/2009 | Currie | H01L 21/76224 257/19 |
| 9,129,827 B2 | 9/2015 | Cappellani et al. | |
| 9,240,447 B1* | 1/2016 | Cheng | H01L 21/02639 |
| 9,472,613 B2 | 10/2016 | Cappellani et al. | |
| 2001/0045604 A1 | 11/2001 | Oda et al. | |
| 2003/0183819 A1 | 10/2003 | Aoki et al. | |
| 2004/0259315 A1 | 12/2004 | Sakaguchi et al. | |
| 2005/0023554 A1 | 2/2005 | Chu et al. | |
| 2007/0138565 A1* | 6/2007 | Datta | H01L 21/823807 257/369 |
| 2007/0298593 A1* | 12/2007 | Yu | H01L 21/84 438/479 |
| 2008/0073639 A1 | 3/2008 | Hudait et al. | |
| 2008/0081404 A1* | 4/2008 | Barna | H01L 21/76232 438/197 |
| 2008/0153218 A1* | 6/2008 | Marshall | H01L 21/76232 438/197 |
| 2008/0210927 A1 | 9/2008 | Hudait et al. | |
| 2009/0155931 A1 | 6/2009 | Ma et al. | |
| 2009/0206367 A1 | 8/2009 | Gauthier, Jr. et al. | |
| 2010/0163848 A1 | 7/2010 | Majhi et al. | |
| 2010/0258844 A1 | 10/2010 | Lidow et al. | |
| 2011/0266595 A1 | 11/2011 | Hata | |
| 2011/0303952 A1 | 12/2011 | Hwang et al. | |
| 2012/0056244 A1 | 3/2012 | Bahl et al. | |
| 2012/0199940 A1 | 8/2012 | Mazzola | |
| 2013/0026482 A1 | 1/2013 | Fenwick | |
| 2013/0095642 A1* | 4/2013 | Nieh | H01L 21/2654 438/493 |
| 2013/0134481 A1 | 5/2013 | Bhuwalka et al. | |
| 2013/0207161 A1 | 8/2013 | Wang et al. | |
| 2013/0214356 A1 | 8/2013 | Cheng et al. | |
| 2014/0285980 A1 | 9/2014 | Cappellani et al. | |
| 2015/0380481 A1 | 12/2015 | Cappellani et al. | |

FOREIGN PATENT DOCUMENTS

| | | |
|---|---|---|
| KR | 20030096703 A | 12/2003 |
| WO | 2013154574 A1 | 10/2013 |
| WO | 2015026371 A1 | 2/2015 |

OTHER PUBLICATIONS

Taiwan Office Action received for Taiwan Application No. 103128395 dated Aug. 2, 2016. 14 pages, including 6 pages of English translation.

International Search Report and Written Opinion received for PCT Patent Application No. PCT/US2012/033472, dated Jan. 2, 2013, 13 Pages.

International Preliminary Report on Patentability received in PCT Application No. PCT/US2012/033472, dated Oct. 14, 2014, 9 pages.

Liang, et al., "Nonselective oxidation of GaAs-based III-V compound semiconductor heterostructures for in-plane semiconductor lasers," Feb. 8, 2007, 14 pages.

International Search Report received for Patent Application No. PCT/US2013/056476, dated on May 23, 2014. 3 pages.

Office Action and Search Report received for TW Application No. 103128305, dated Jan. 8, 2016. 12 pages; including 6 pages of English Translation.

Extended European Search Report Received for EP Application No. 13891735.6. dated Feb. 20, 2017. Received: Feb. 22, 2017. 14 pages.

International Preliminary Report on Patentability and Written Opinion received for Patent Application No. PCT/US2013/056476, dated Mar. 3, 2016. 12 pages.

* cited by examiner

HIGH RESISTANCE LAYER FOR III-V CHANNEL DEPOSITED ON GROUP IV SUBSTRATES FOR MOS TRANSISTORS

BACKGROUND

Transistors are semiconductor devices that are commonly used as switches capable of selectively shutting off an electric current. In metal-oxide-semiconductor (MOS) transistors, the current is intended to flow from source to drain directly through the channel region during the on-state of the device. However, shunt paths can cause the current to flow through other paths that bypass the channel region. Such shunt paths can cause a transistor to have high leakage and potentially even short circuit.

Figure 1A:
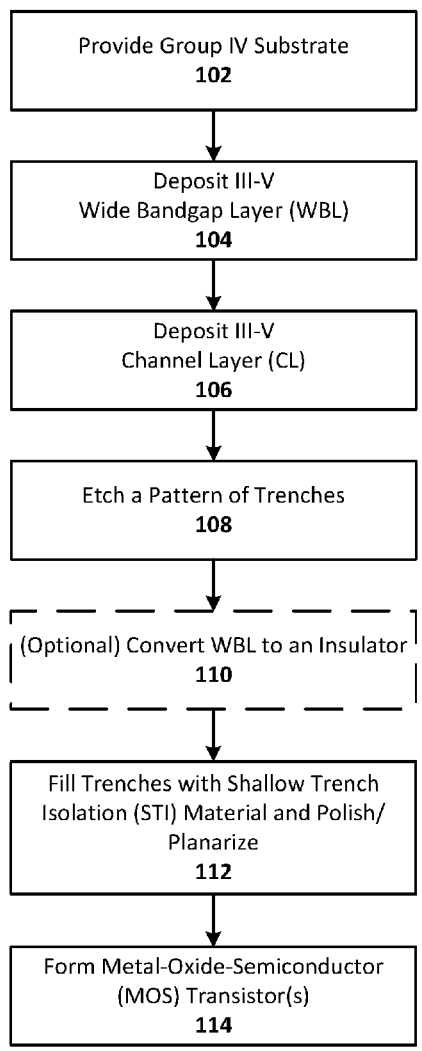
FIG. 1a illustrates a deposit then pattern method for fabricating an integrated circuit having a high resistance layer between a III-V channel layer and a group IV substrate, in accordance with one or more embodiments of the present disclosure.

As will be appreciated, the figures are not necessarily drawn to scale or intended to limit the claimed disclosure to the specific configurations shown. For instance, while some figures generally indicate straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed for using a high resistance layer between a III-V channel layer and a group IV substrate for semiconducting devices, such as metal-oxide-semiconductor (MOS) transistors. The high resistance layer can be used to minimize (or eliminate) current flow from source to drain that follows a path other than directly through the channel. In some cases, the high resistance layer may be a III-V wide bandgap layer. In some such cases, the wide bandgap layer may have a bandgap greater than 1.4 electron volts (eV), and may even have a bandgap greater than 2.0 eV. In other cases, the wide bandgap layer may be partially or completely converted to an insulator (or at a minimum, to a higher bandgap semiconductor) through oxidation or nitridation, for example. The resulting structures may be used with planar, finned, or nanowire/nanoribbon transistor architectures to help prevent substrate leakage problems. Numerous variations will be apparent in light of this disclosure.

General Overview

As previously explained, transistors should be capable of shutting off the electrical current and shunt paths are to be avoided. Depositing III-V materials on group IV substrates (e.g., silicon substrates) creates regions where material from the III-V layer (or precursors of the III-V material deposition process) diffuses into the substrate and/or material from the substrate diffuses into the III-V material layer. In addition, the region near the substrate/III-V interface is heavily disordered with stacking faults, dislocations, and domain boundaries. These imperfections may increase overall conductivity or provide shunt paths for current leakage. The doping of channel layers in a metal-oxide-semiconductor (MOS) transistor must be carefully controlled and maintained below a threshold level to avoid current leakage. These and other material compatibility problems when depositing III-V materials on group IV substrates can cause undesired shunt paths where the current flow from source to drain follows a path other than directly through the channel.

Thus, and in accordance with one or more embodiments, techniques are provided for using a high resistance layer between a III-V channel layer and a group IV substrate for semiconducting devices, such as MOS transistors. The techniques can be used to electrically isolate the III-V channel layer from all underlying layers. Note that "electrical isolation" as used herein does not necessitate full or complete electrical isolation. For example, in some embodiments, the high resistance layer may cause a high resistance to current flow, which can act to essentially isolate the channel layer from all underlying layers under normal operating conditions. In some embodiments, the high resistance layer may be a III-V wide bandgap layer (e.g., with a bandgap greater than 1.4 electron volts (eV)), while in other embodiments, the high resistance layer may start as a III-V wide bandgap material but then be at least partially converted to an insulator material. The high resistance layer can be used to minimize (or eliminate) current flow from source to drain that follows a path other than directly through the channel.

The deposition of the III-V layers (the wide bandgap layer and the channel layer) may be performed before or after patterning the group IV substrate. For example, in some embodiments, the layers may be deposited over the entire substrate (or large portions of it) to create a substrate/wide bandgap layer/channel layer blank, while in other embodiments, the III-V layers may be more selectively deposited as stacks within trenches formed in the substrate, as will be discussed in turn. After depositing the III-V layers on the substrate, the wide bandgap layer may be converted to an insulator using, for example, an under-fin oxide (UFO) process. The UFO process may include masking the III-V layer stack to cover and protect the channel layer and then exposing the channel stack to a conversion gas to cause, for example, oxidation or nitridation to the wide bandgap layer. If the wide bandgap layer is not converted to an insulator, then the entire III-V layer stack may be semiconducting and may be used as a part of the channel region. If the wide bandgap layer is converted to an insulator, then the channel stack will have an active top layer that will remain semiconducting while a portion or all of the lower section may be converted to an insulator (depending upon the completeness of conversion).

As will be apparent in light of this disclosure, the resulting channel stack may be used for one or more n-channel semiconductor devices (e.g., for n-MOS). In some embodiments, the resulting structures (including a III-V multilayer channel stack or a channel stack having a III-V channel layer on an at least partially converted insulator layer) may be used with planar, finned, or nanowire/nanoribbon transistor architectures. The structures may also be integrated with p-channel diffusion regions (e.g., for p-MOS), such as by masking the III-V layer stacks and depositing suitable material (e.g., Si, Ge, or alloys of group IV materials) in spaces between already formed III-V layer stacks, as will be described in more detail below.

The channel layer may be comprised of a high electrical carrier mobility material having a bandgap at or below 1.4 eV, such as indium antimonide (InSb), indium gallium arsenide (InGaAs), gallium arsenide (GaAs), indium arsenide (InAs), or other suitable III-V materials as will be apparent in light of this disclosure. The high resistance layer may be chosen to have a bandgap greater than 1.4 eV (and in some cases, greater than 2.0 eV), and may be comprised of materials such as indium aluminum arsenide (InAlAs), indium aluminum phosphide (InAlP), aluminum phosphide (AlP), aluminum antimonide (AlSb), aluminum arsenide (AlAs), gallium indium phosphide (GaInP), indium phosphide (InP), gallium phosphide (GaP), or other suitable III-V materials as will be apparent in light of this disclosure. In some embodiments, the wide bandgap layer material may be selected based on the channel layer material (or vice versa) to ensure that the difference in bandgap between the two III-V layers is at least 0.4 eV, for example.

The selected thicknesses for the III-V layers may be based on a number of different considerations, such as the chosen materials, the desired amount of electrical isolation provided to the channel layer, manufacturing (e.g., cost) and environmental (e.g., toxicity) considerations, and whether or not the wide bandgap layer will be converted to an insulator, just to name a few example considerations. In some embodiments, the thicknesses of the III-V layers may be less than 7500, 5000, 2500, or 1500 Å thick, or less than some other suitable amount as will be apparent in light of this disclosure. In some embodiments, the III-V layers may each have a single composition where there is an abrupt change between the deposition of each layer. While in other embodiments, the deposition of the III-V materials may include a graded, stepped, or transitioned deposition from the wide bandgap layer material to the channel layer material. In some embodiments, the selection of materials and composition gradients can reduce the dislocation and stacking fault densities to 1E6 dislocations per $cm^2$ or less. Therefore, the multilayer approach for a III-V channel can provide higher quality films, as will be apparent in light of this disclosure.

Upon analysis (e.g., composition mapping), a structure configured in accordance with one or more embodiments will effectively show a high resistance layer material sandwiched between a III-V channel layer material and a group IV substrate material. In some embodiments, other layers may be apparent (e.g., a highly defective layer at the substrate/III-V interface). A scanning electron microscopy (SEM), transmission electron microscopy (TEM), and/or energy dispersive x-ray (EDX) analysis of a cross-section perpendicular to gate lines or channel regions of a semiconductor device can be used to measure the composition of the device's layers. Bandgap is a direct consequence of composition. Therefore, the bandgap of each layer of a semiconductor device configured in accordance with an embodiment of the present disclosure can be determined based on, for example, the composition of the layer. In some embodiments, the composition of the high resistance layer may be a III-V wide bandgap material having a bandgap determined to be greater than a III-V channel material. In other embodiments, the composition of the high resistance layer may be a III-V wide bandgap material that was partially or completely converted to an insulator material.

Transistor structures configured in accordance with one embodiment of the present disclosure provide an improvement over conventional structures with respect to, at least, higher resistance to current flow between the source and drain regions through a path other than directly through the channel. Any number of semiconductor devices or circuitry having a need for high performance transistors benefit from using a high resistance layer between a III-V channel layer and a group IV substrate. The techniques as variously described herein may provide cost benefits and may minimize toxicity relating to process effluent as well as disposal at end of life compared to current techniques, particularly in embodiments where thinner III-V layers are deposited (e.g., layers less than 1500 Å thick). Further, the techniques as variously described herein are compatible with complementary MOS (c-MOS) integration, since the structures are compatible with intermixed p-type and n-type regions. Numerous configurations and variations will be apparent in light of this disclosure.

Methodology and Architecture

Figure 1B:
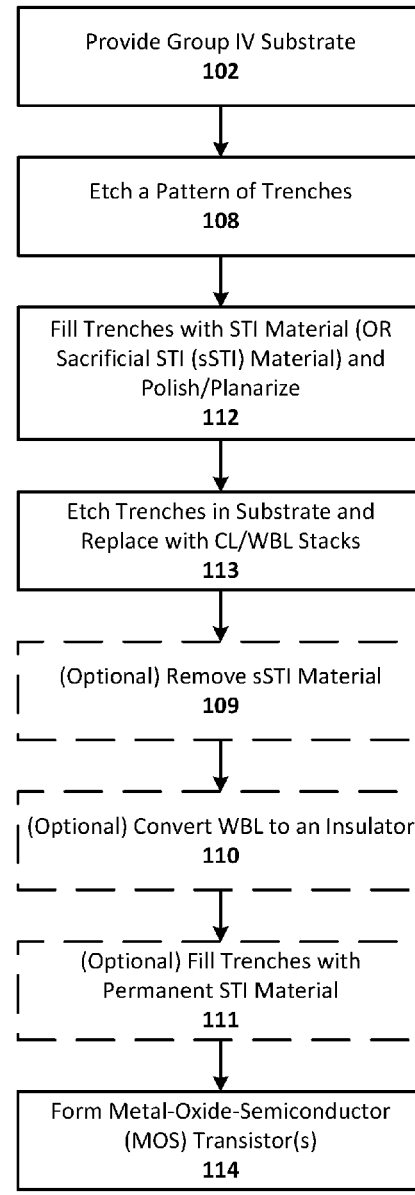
FIG. 1b illustrates a pattern then deposit method for fabricating an integrated circuit having a high resistance layer between a III-V channel layer and a group IV substrate, in accordance with one or more embodiments.

FIG. 1a illustrates a deposit then pattern method for fabricating an integrated circuit having a high resistance layer between a III-V channel layer and a group IV substrate, in accordance with one or more embodiments of the present disclosure. As will be discussed in turn, Figure 1b illustrates a pattern then deposit method for fabricating an integrated circuit having a high resistance layer between a III-V channel layer and a group IV substrate, in accordance with one or more embodiments. As will be apparent in light of this disclosure, the high resistance layer includes a wide bandgap layer that may or may not be converted to an insulator. Therefore, the term channel stack may be used to refer to both a stack of channel layer on wide bandgap layer and a stack of channel layer on insulator layer (e.g., a converted wide bandgap layer).

Figure 2A:
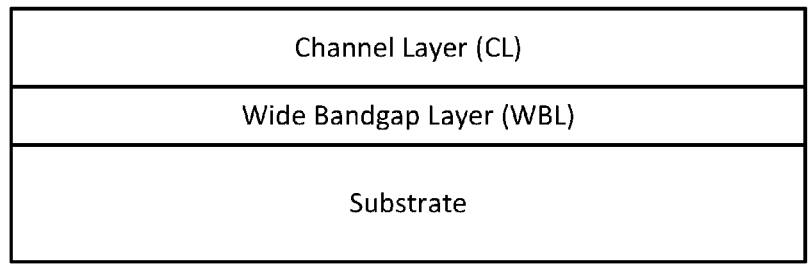
FIGS. 2a-c illustrate example structures that are formed as the method of Figure 1a is carried out, including a high resistance layer that is a III-V wide bandgap layer, in accordance with an embodiment.
Figure 2B:
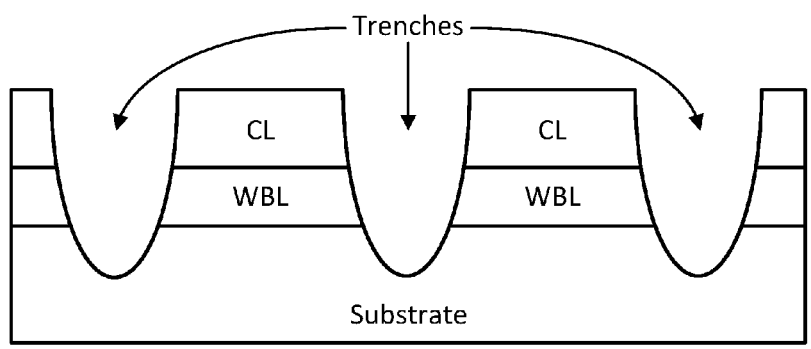
Figure 2C:
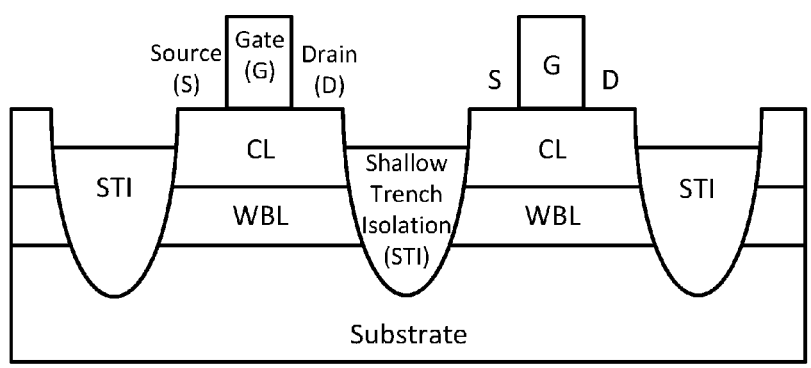

FIGS. 2a-c illustrate example structures that are formed as the method of FIG. 1a is carried out, including a high resistance layer that is a III-V wide bandgap layer, in accordance with an embodiment. In this embodiment, the dotted box shown in the method, which includes converting 110 the wide bandgap layer to an insulator, is not performed. Further, in this embodiment, the wide bandgap layer may be a part of the semiconducting channel stack used by one or more subsequently formed MOS transistors, as will be discussed below. FIGS. 3a-f illustrate example structures that are formed as the method of Figure 1a is carried out, including a high resistance layer that has been converted to an insulator layer, in accordance with an embodiment. In this embodiment, the dotted box shown in the method is performed. Further, in this embodiment, only the top channel layer remains semiconducting for use by one or more subsequently formed MOS transistors, as will be discussed below.

Figure 3A:
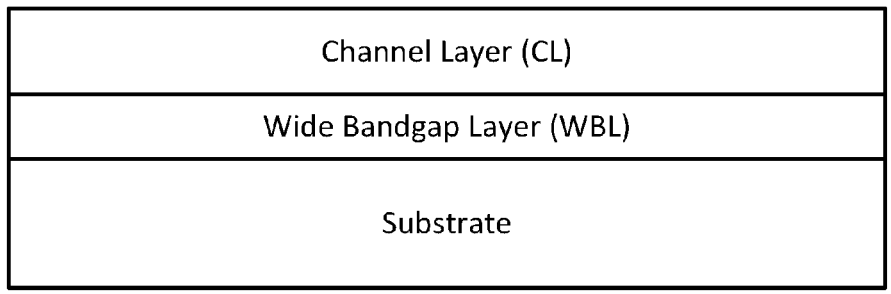
FIGS. 3a-f illustrate example structures that are formed as the method of Figure 1a is carried out, including a high resistance layer that has been converted to an insulator layer, in accordance with an embodiment.

The example method shown in Figure 1a includes providing 102 a group IV substrate. The group IV substrate may include any combination of silicon (Si), germanium (Ge), tin (Sn), and/or carbon (C), such as Si, SiGe, Ge, etc. The method continues with depositing III-V layers on the substrate. First, a III-V wide bandgap layer is deposited 104 on the substrate and then a III-V channel layer is deposited 106 on the wide bandgap layer. Depositing 104 the III-V wide bandgap layer may cause an initial highly defective growth region at the interface of the III-V wide bandgap layer and the group IV substrate. As will be apparent in light of this disclosure, the wide bandgap layer may be used to electrically isolate the channel layer from all underlying layers, including the group IV substrate and the highly defective growth region at the IV/III-V interface. The III-V growth, discussed in detail below, may be performed in a planar manner across the entire substrate or in large areas (e.g., >1 um×>1 um) within patterned areas of the substrate, for example. The resulting structure after the III-V layers have been deposited 104, 106 is shown in FIGS. 2a and 3a as the substrate/wide bandgap layer/channel layer blank.

In some embodiments, the III-V wide bandgap layer material may be chosen to lattice match the III-V channel layer material. Lattice matching may provide the benefit of minimizing film stress and may also allow a region of bandgap change to be formed without introducing a change in crystal structure. In addition, the III-V wide bandgap layer material may be chosen to have a higher bandgap than the III-V channel layer material to electrically isolate the channel layer from underlying layers. Note that "electrical isolation" as used herein does not necessitate full or complete electrical isolation. For example, the wide bandgap layer's higher bandgap relative to the channel layer may cause a high resistance to current flow, which can act to essentially isolate the channel layer from all underlying layers under normal operating conditions. In some embodiments, the channel layer may be comprised of a high electrical carrier mobility material having a bandgap at or below 1.4 eV. In some such embodiments, the material for the wide bandgap layer may be chosen such that it has a bandgap of at least 1.4, 1.6., 1.8, 2.0, or 2.2 eV, or some other suitable bandgap based on the chosen channel layer material. In some embodiments, the wide bandgap layer and channel layer materials may be chosen to achieve a desired difference in bandgap between the III-V layers. For example, the III-V materials may be chosen such that the difference is at least 0.2, 0.4, 0.6, 0.8, or 1.0 eV, or some other suitable bandgap difference as will be apparent in light of this disclosure.

In some embodiments, examples of materials for the channel layer may include: indium antimonide (InSb), indium gallium arsenide (InGaAs), gallium arsenide (GaAs), indium arsenide (InAs), or other suitable III-V materials as will be apparent in light of this disclosure. For example, in some embodiments, the channel layer may include any III-V material having a bandgap less than 1.4 eV. In some embodiments, examples of materials for the wide bandgap layer may include: indium aluminum arsenide (InAlAs), indium aluminum phosphide (InAlP), aluminum phosphide (AlP), aluminum antimonide (AlSb), aluminum arsenide (AlAs), gallium indium phosphide (GaInP), indium phosphide (InP), gallium phosphide (GaP), or other suitable III-V materials as will be apparent in light of this disclosure. For example, in some embodiments, the wide bandgap layer may include any III-V material having a bandgap greater than 1.4 eV. In some embodiments, combinations of materials for the channel layer and wide bandgap layer, respectively, may include: InGaAs and InAlAs, InGaAs and GaP, GaAs and InAlP, GaAs and AlAs, GaAs and GaInP, InAs and AlSb, or any other suitable combination of III-V materials as will be apparent in light of this disclosure. In one example combination of III-V materials, the channel layer can comprise InGaAs, having a bandgap of approximately 0.7 eV, and the wide bandgap layer can comprise InAlAs (e.g., $In_{0.75}Al_{0.25}As$), having a bandgap of approximately 2 eV. Numerous other suitable III-V materials for the channel layer and wide bandgap layer will be apparent in light of this disclosure.

The thicknesses of the III-V layers can vary depending on the chosen materials, deposition techniques, and desired amount of electrical isolation provided to the channel layer. The thicknesses of the III-V layers may also be chosen based on the manufacturing costs related to depositing such layers, in some instances. For example, depositing very thick layers of undoped III-V material may be impracticable in a high volume manufacturing scenario due to the high costs associated with depositing such layers. The effect on the environment may be another consideration related to the thicknesses of the III-V layers, in some instances. For example, the thicknesses may be selected to minimize toxicity to the environment, such as when integrated circuits containing transistors fabricated using a high resistance layer as variously described herein are disposed. Another consideration for the thicknesses of the III-V layers is whether the wide bandgap layer is to be converted to an insulator as discussed herein. In some embodiments, the thicknesses of the III-V layers may be less than 7500, 5000, 2500, or 1500 Å thick, or less than some other suitable amount as will be apparent in light of this disclosure. In a more general sense, the III-V layers can have any thicknesses that allow the wide bandgap layer to electrically isolate the channel layer from underlying layers, whether or not the wide bandgap layer is to be converted to an insulator. The wide bandgap and channel layers are not intended to be limited to any particular dimensions.

The deposition techniques for the III-V layers may include chemical vapor deposition (CVD), rapid thermal CVD (RTCVD), molecular beam epitaxy (MBE), gas source MBE (GS-MBE), or any other suitable deposition technique. In one example embodiment, depositing a III-V channel stack of InP for the wide bandgap layer and InGaAs for the channel layer may include a process employing trimethylindium (TMI) and phosphine ($PH_3$) with a III/V ratio of 50 at 500° C. and 20 Torr followed by a process employing TMI, trimethylgallium (TMG), and arsine ($AsH_3$) with a III/V ratio of 50 at 500° C. and 20 Torr. In some embodiments, the deposition of the III-V materials may include an abrupt change between the deposition of the wide bandgap layer material and the channel layer material. In such embodiments, the abrupt change may increase electrical isolation of the channel layer from underlying layers. In other embodiments, the deposition of the III-V materials may include a graded, stepped, or transitioned deposition from the wide bandgap layer material to the channel layer material. In such embodiments, the deposition may be graded, stepped, or transitioned to increase film quality. In some embodiments, deposition techniques may be used to alter the bandgap of the channel layer and/or the wide bandgap layer to assist with the electrical isolation of the channel layer, for example. In one example embodiment, the bandgap of the wide bandgap layer can be increased by alloying with small atomic fractions of nitrogen (e.g., less than 10%, 5%, or 1%). In some embodiments, the materials and composition gradients for the III-V channel stack can be selected to reduce dislocation and stacking fault densities. In one example embodiment, the threading dislocation and stacking fault densities can be reduced to 1E6 dislocations per $cm^2$, or less.

Figure 3B:
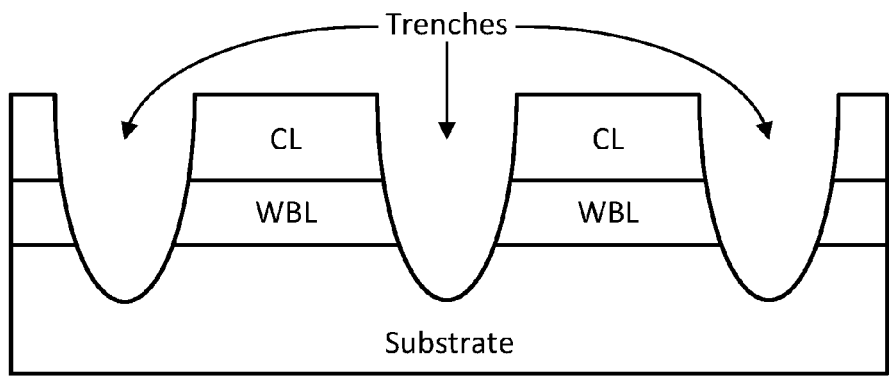

With further reference to FIG. 1a, after the III-V channel stack (the wide bandgap layer and the channel layer) has been deposited on the substrate to form the blank shown in FIGS. 2a and 3a, the method continues with etching 108 to form a pattern of trenches. Any suitable dry and/or wet etch processes can be used. FIGS. 2b and 3b show the structure after etching is complete, in accordance with example embodiments. In some embodiments, the trench formation may be chosen based on the desired structure for one or more subsequently formed MOS transistors. For example, the trenches may create linear diffusion regions that may be considered fins if they are narrow (e.g., <30 nm) or planar diffusion regions if they are wider. Any suitable trench size and shape may be used as desired, as will be apparent in light of this disclosure.

The method shown in FIG. 1a continues with an optional conversion 110 of the wide bandgap layer to an insulator. As previously described, the example structures shown in FIGS. 2a-c do not include conversion 110, and therefore, the wide bandgap layer is maintained as the high resistance layer in the channel stack. As can be seen in FIG. 2c, the method shown in FIG. 1a (skipping the optional conversion 110) continues with filling 112 the etched trenches with STI material, such as one or more dielectric materials (e.g., silicon dioxide). The depth of the STI fill may be chosen based on the desired structure for one or more subsequently formed MOS transistors. For example, the STI fill may be recessed as shown in FIG. 2c to allow the channel stack to emerge from the plane. The STI depth is such that only the channel layer emerges from the plane in the embodiment as shown; however, in another embodiment, the STI depth may be shallower to allow both the wide bandgap layer and the channel layer to emerge. In yet another embodiment, the STI fill may be level with the top of the channel layer, for use with subsequent planar MOS transistor structures, for example. Any suitable STI fill depth may be chosen, as will be apparent in light of this disclosure. As previously described, the wide bandgap layer remains a part of the channel stack and is used to minimize (or eliminate) current flow from source to drain that follows a path other than directly through the channel.

The method continues with forming 114 one or more MOS transistors on the resulting structure. Such formation 114 may include any suitable formation of a gate, source, and drain on the channel stack fins (e.g., as shown in FIG. 2c). However, the MOS transistor structures can also be planar or nanowire/nanoribbon structures, based on the size of the diffusion regions and/or based on the STI fill depth. In some embodiments, integration with suitable p-channel material fins of a different composition such as Si, Ge, or alloys of group IV materials can be achieved by masking the III-V channel stack fins and depositing the material having the different composition in the space(s) between the already formed III-V fins. In such embodiments, the III-V channel stack fins may be used for n-channel transistors (e.g., n-MOS) and diffusion or fins of different composition may be used for p-channel transistors (e.g., p-MOS), and therefore, c-MOS integration can be achieved.

Figure 3C:
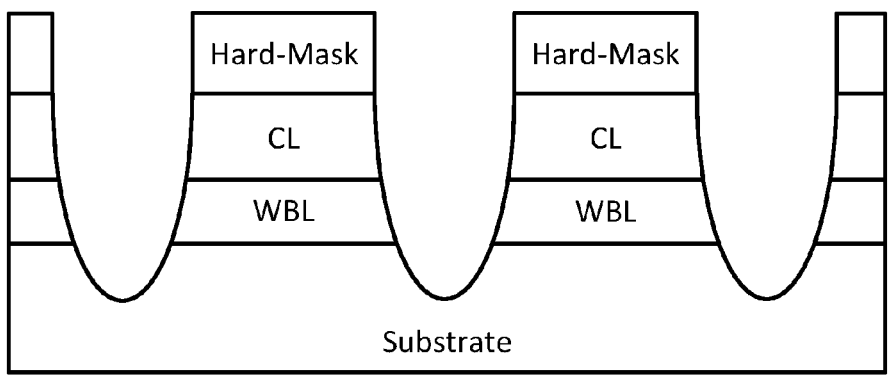
Figure 3D:
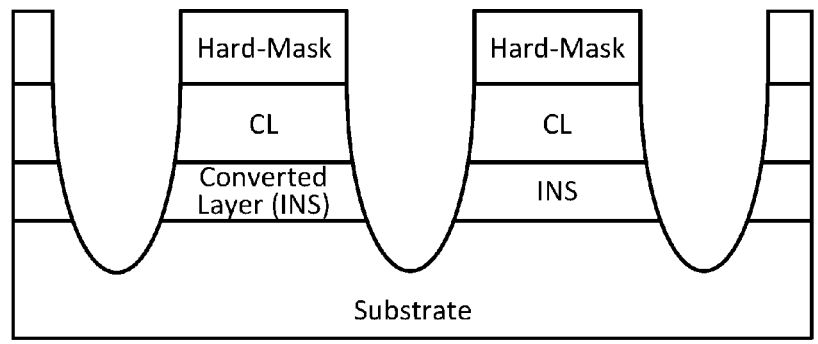

The structures shown in FIGS. 3a-f include conversion 110, in accordance with an embodiment. After etching 108 a pattern of trenches as previously described, the method continues with converting 110 the wide bandgap layer to an insulator. As a result, the converted insulator layer becomes the high resistance layer in the channel stack, in this example embodiment. In some embodiments, conversion 110 may include an under-fin oxidation (UFO) process such that the wide bandgap layer is converted to an insulator, but the channel layer is not. Such a UFO process may include forming hardmask over the channel stack (e.g., on the channel layer), as shown in FIG. 3c. Any suitable hardmask process can be used and hardmask material may include silicon nitride (SiN), boron nitride (BN), aluminum oxide ($Al_2O_3$), or any other suitable material. In some embodiments, spacers (not shown) or other protective layers may be deposited on the sides of the channel layer to provide additional protection for the channel layer. FIG. 3d shows the resulting structure after the wide bandgap layer has been converted to an insulator through which appreciable current cannot pass.

In some embodiments, conversion 110 is carried out by annealing the structure to cause, by oxidation or nitridation, the wide bandgap layer to be converted to an insulator. Depending on the duration of the annealing process, substantially the entire wide bandgap layer may be partially or completely converted to a dielectric material that electrically isolates the channel layer from all underlying layers. In general, the exposed surface of the wide bandgap layer will generally convert first, with the remainder of the wide bandgap layer to follow, should sufficient time be allocated to the annealing process. In one example embodiment, an oxidizing (or nitriding) atmosphere is used, where oxygen (or nitrogen) gas is provided during the annealing process. The gas flow can be any suitable flow (e.g., oxygen flow from about 1 sccm to about 50 sccm), and the annealing temperature range can vary depending on the materials of the structure. In one example embodiment, conversion may be performed by furnace oxidation at 400° C. for 30 minutes in oxygen containing ambient. In a more general sense, the wide bandgap layer may be converted at a temperature that does not damage or otherwise adversely impact the overall structure or performance of the device being formed. The duration, as well as other factors during the conversion process, may affect the resulting structure of the converted layer, either in degree or percentage of oxygen/nitrogen concentration, or in the percentage of wide bandgap layer material converted. Numerous other thermal annealing and oxidation (or nitridation) schemes can be used, such as oxygen implantation and/or leveraging oxidizing material adjacent to the wide bandgap layer, for example.

The resulting material of the high resistance layer where the wide bandgap layer was converted to an insulator may depend upon the initial III-V material of the wide bandgap layer and/or the conversion technique used. For example, in some embodiments, aluminum (Al) can be incorporated in wide bandgap layer material to increase the oxidation and nitridation rate relative to non Al containing material. In some such embodiments, where the wide bandgap layer material includes Al, the wide bandgap layer may be converted to a dielectric such as aluminum oxide ($Al_2O_3$). In other embodiments, indium (In) and gallium (Ga) oxides would not likely form an oxide with usable mechanical properties. In some such embodiments, the conversion process may cause the oxidized wide bandgap layer to be treated as an air gap. The oxide can be removed to make it a true air gap or left to be a non-robust (e.g., prone to cracking and crumbling) material. Once the wide bandgap layer has been converted, the hardmask can be removed (e.g., using any combination of wet/dry etching) and the trenches formed by etch 108 can be filled 112.

Figure 3E:
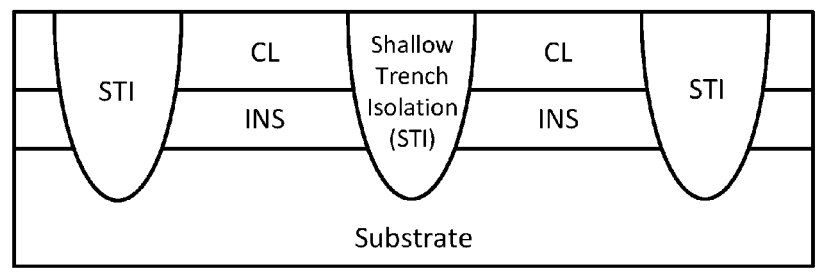

FIG. 3e shows the resulting structure after the wide bandgap layer has been converted to an insulator and the trenches have been filled with an STI insulating material. Note that in some cases, the converted insulator layer material and the STI fill material may be the same material.

Figure 3F:
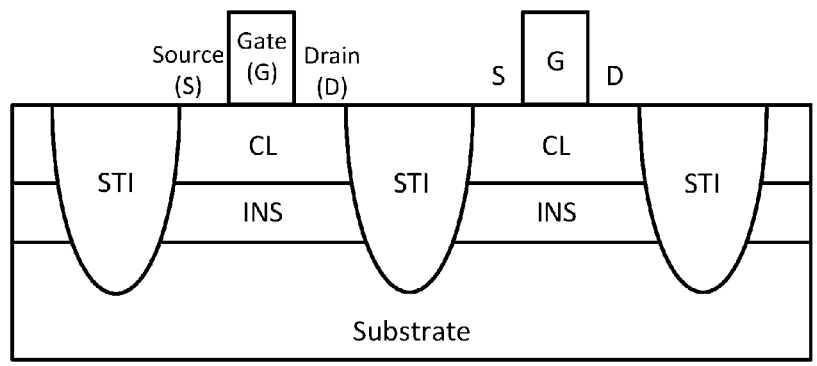

In such cases, the insulator layer formed during the conversion process may be distinguished from other adjacent subsequently added electrically isolating material (e.g., STI fill material), even if composed of the same material. Also note that the STI fill is shown at the same level as the channel layer, which may be suitable for one or more subsequently formed planar MOS transistors, for example. FIG. 3*f* shows such an example planar MOS structure, after gate, source, and drain regions were formed 114 on the planar channel layer. As previously described, the structure may include the integration of p-channel transistors by filling the trenches shown in FIG. 3*e* with suitable p-channel material, such as Si, Ge, or alloys of group IV materials, for example, and therefore, c-MOS integration can be achieved.

As previously described, FIG. 1*b* illustrates a pattern then deposit method for fabricating an integrated circuit having a high resistance layer between a III-V channel layer and a group IV substrate, in accordance with one or more embodiments. The method illustrated in Figure 1b is similar to the method illustrated in FIG. 1*a* and described above, except that in the method shown in FIG. 1*b* (and described herein), the III-V layer channel stack is deposited in trenches patterned and etched out of the group IV substrate, as opposed to the III-V layer deposition first techniques described with reference to FIG. 1*a*. FIGS. 4*a-f* illustrate example structures that are formed as the method of FIG. 1*b* is carried out, including a high resistance layer that is a III-V wide bandgap layer, in accordance with an embodiment. In this embodiment, the dotted boxes shown in the method, which includes processes used to convert the wide bandgap layer to an insulator, are not performed. FIGS. 5*a-i* illustrate example structures that are formed as the method of FIG. 1*b* is carried out, including a high resistance layer that has been converted to an insulator layer. In this embodiment, the dotted boxes shown in the method are performed.

Figure 4A:
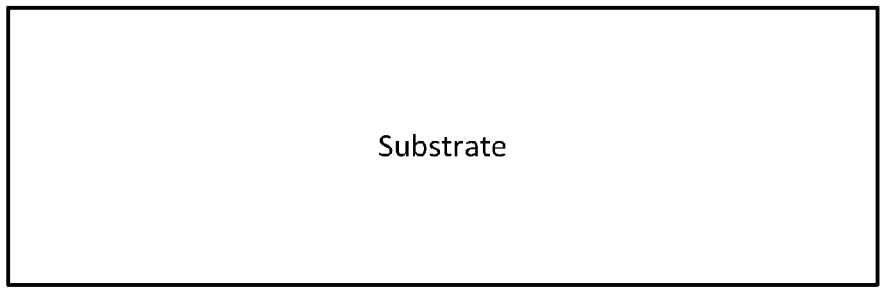
FIGS. 4a-f illustrate example structures that are formed as the method of Figure 1b is carried out, including a high resistance layer that is a III-V wide bandgap layer, in accordance with an embodiment.
Figure 4B:
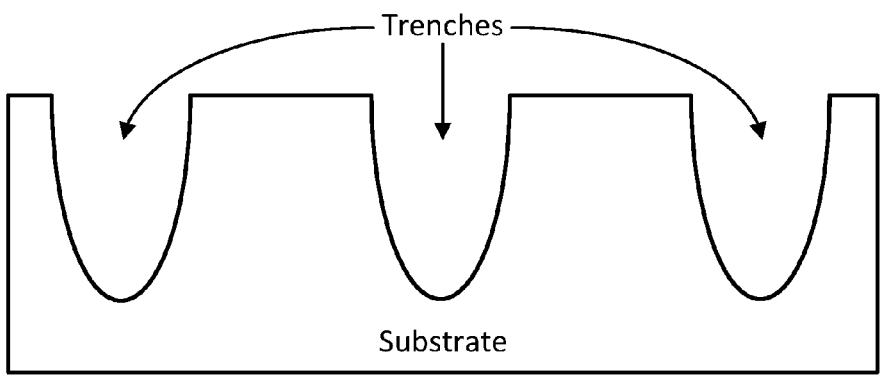
Figure 4C:
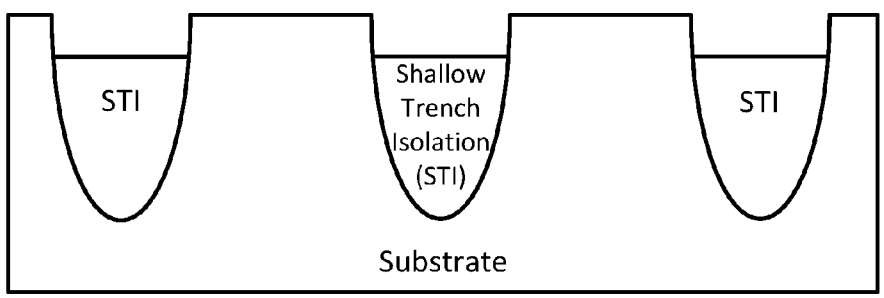
Figure 4D:
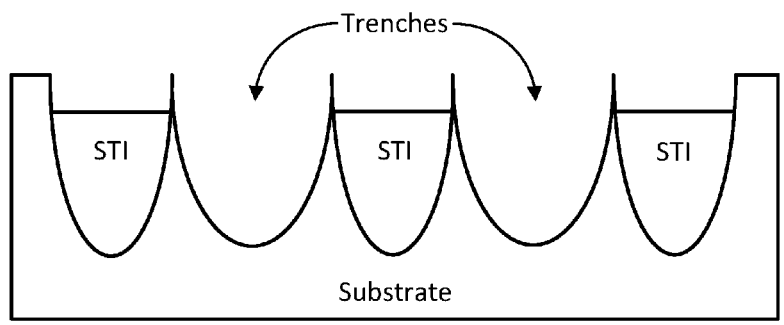
Figure 4E:
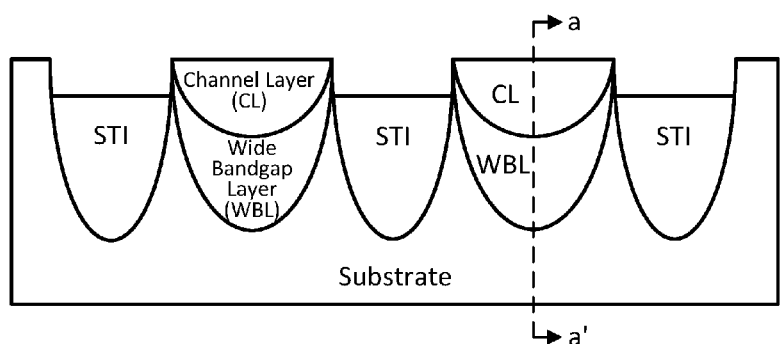
Figure 5A:
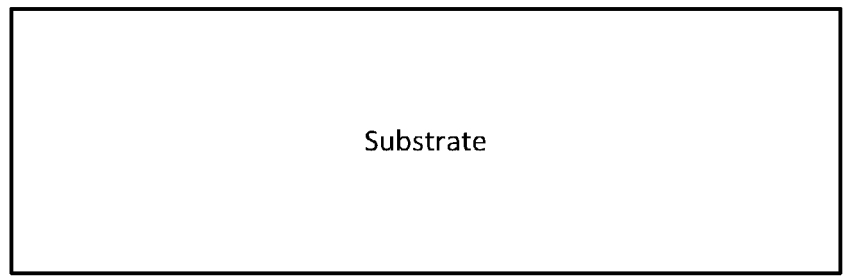
FIGS. 5a-i illustrate example structures that are formed as the method of Figure 1b is carried out, including a high resistance layer that has been converted to an insulator layer, in accordance with an embodiment.
Figure 5B:
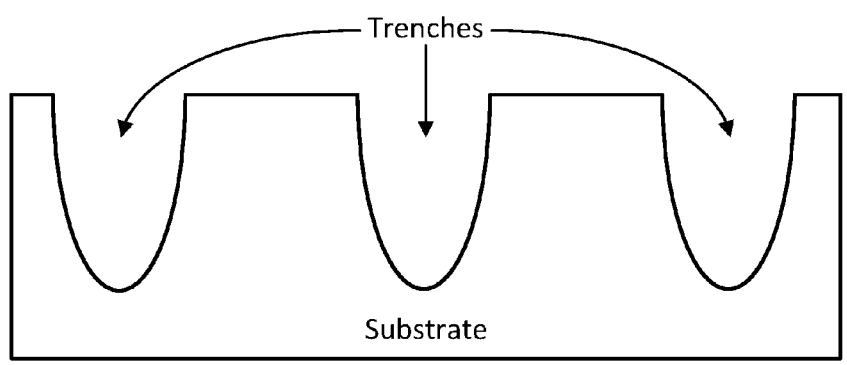
Figure 5C:
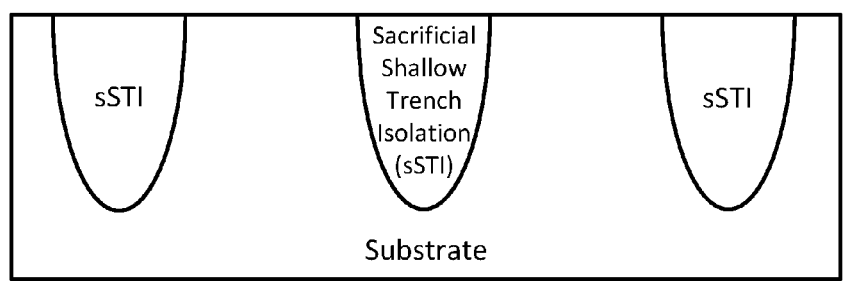
Figure 5D:
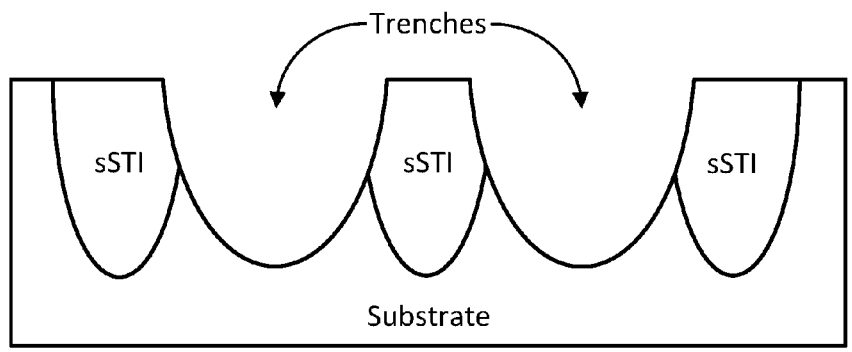
Figure 5E:
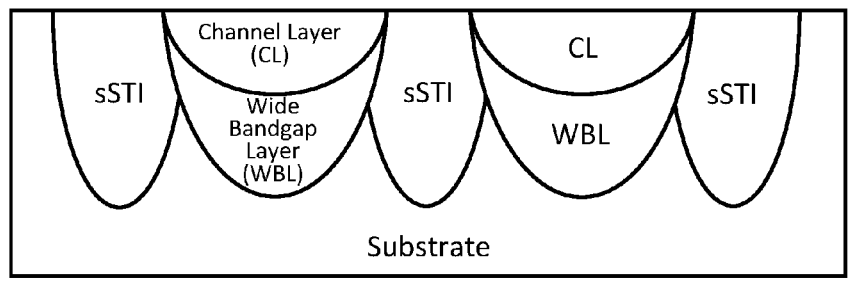

The example method shown in FIG. 1*b* includes providing 102 a group IV substrate, as shown in FIGS. 4*a* and 5*a*. As previously described, the group IV substrate may include any combination of silicon (Si), germanium (Ge), tin (Sn), and/or carbon (C), such as Si, SiGe, Ge, etc. The method continues with etching 108 a pattern of trenches in the substrate as shown in FIGS. 4*b* and 5*b*. Any suitable dry and/or wet etch processes can be used. In the embodiment shown in FIG. 4*c*, the method continues with filling 112 the trenches with an STI material (e.g., as previously described) and may also include a polish/planarization process. Alternatively, in the embodiment shown in FIG. 5*c*, the method continues with filling 112 the trenches with a sacrificial STI (sSTI) material (e.g., a sacrificial oxide) that can be removed to expose the subsequently deposited wide bandgap layer to an oxidizing or nitriding environment to convert it to an insulator, as previously described. The method continues with etching 113 trenches in the substrate and replacing the trenches by depositing a III-V stack of including a wide bandgap layer and channel layer. The previous discussion with respect to the wide bandgap layer and the channel layer (including materials, thicknesses, and deposition techniques) is equally applicable here (except that the layers are deposited in the substrate trenches instead of as a blanket deposition on the substrate, as previously described). FIGS. 4*d* and 5*d* show the structures after etching of the trenches and FIGS. 4*e* and 4*d* show the resulting structure after deposition of the III-V layers.

Figure 4F:
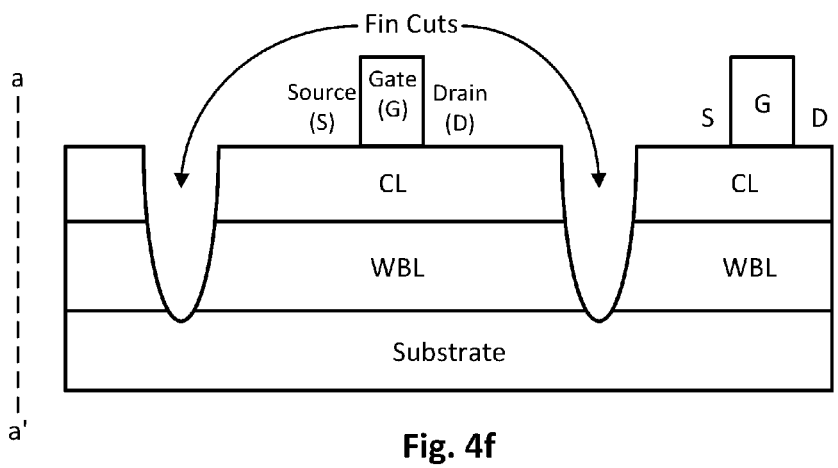

In the embodiment shown in FIGS. 4*a-f*, the wide bandgap layer is not converted to an insulator. Instead, the wide bandgap layer remains a part of the channel stack and is used to minimize (or eliminate) current flow from source to drain that follows a path other than directly through the channel. Therefore, the method of Figure 1b can continue with forming 114 one or more MOS transistors on the resulting structure shown in FIG. 4*e*. For example, rotating the structure shown in FIG. 4*e* by 90 degrees to show the portion of the structure along line a-a', finned MOS transistor structures (including a gate, source and drain) can subsequently be formed on the channel stacks as shown in FIG. 4*f*. Note that the STI fill (e.g., as shown in FIGS. 4*c-e*) was recessed to form the finned channel structure shown. The previous discussion with respect to STI fill depth is equally applicable here. However, the MOS transistor structures can also be planar or nanowire/nanoribbon structures, based on the size of the diffusion regions and/or based on the STI fill depth.

In some embodiments, some of the group IV substrate fins that were etched and replaced 113 in the method of Figure 1b may have been masked and left to exclude them from being etched out to integrate p-channel transistors (e.g., p-MOS). Alternatively, a double etch and replace process (including masking) can be used to create subsets of III-V channel stacks and channel stacks of a suitable p-channel material that is different from the substrate (e.g., Ge fins for a Si substrate). In such embodiments including p-channel regions, the III-V channel stack fins may be used for n-channel transistors (e.g., n-MOS) and the group IV fins may be used for p-channel transistors (e.g., p-MOS), and therefore, c-MOS integration can be achieved.

Figure 5F:
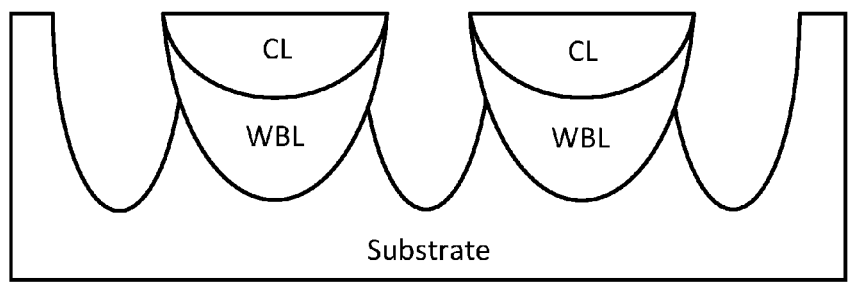
Figure 5G:
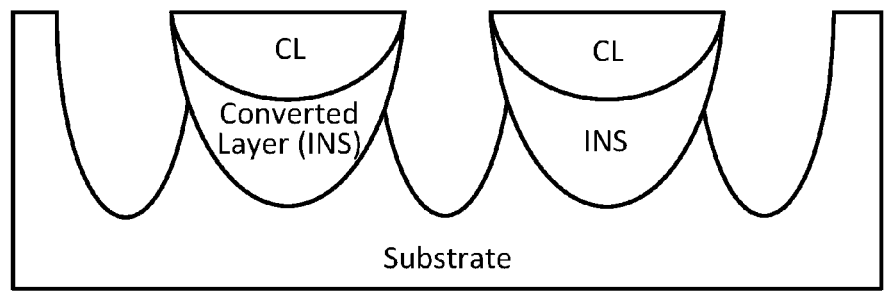
Figure 5H:
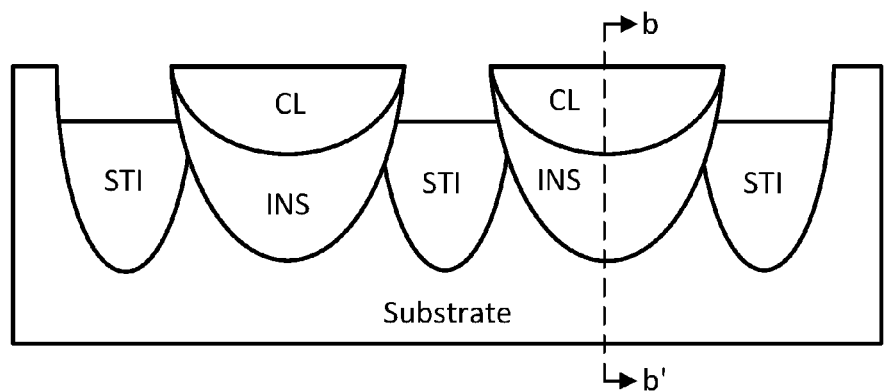

In the embodiment shown in FIGS. 5*a-i*, the wide bandgap layer is converted to an insulator. With further reference to FIG. 1*b*, and continuing from the etch and replace process 113 previously described, the method continues by removing 109 the sSTI material, as shown in FIG. 5*f*. Any suitable removal process may be used (e.g., a dry/wet etch depending upon the sSTI material). Note that a portion of the wide bandgap layer is exposed in this example embodiment after sSTI is removed, because the trenches formed to make the structure shown in FIG. 5*d* cut into the sSTI material. In other embodiments, the trenches may be formed to expose more or less of the wide bandgap layer. After the sSTI material has been removed, the method continues with converting 110 the wide bandgap layer to an insulator. The previous discussion with respect to converting 110 the wide bandgap layer to an insulator is equally applicable here. For example, a hardmask may be used to cover and protect the channel layer during oxidation/nitridation of the wide bandgap layer (not shown). After the wide bandgap layer has been converted 110 to an insulator layer (e.g., as shown in FIG. 5*g*), the trenches that previously contained the sSTI material can be filled 111 with permanent STI material. FIG. 5*h* shows the structure after a fill 111 has been performed. Note that the STI fill is recessed in this example embodiment to allow a portion of the channel stack (including the channel layer and the converted insulator layer) to be exposed.

Figure 5I:
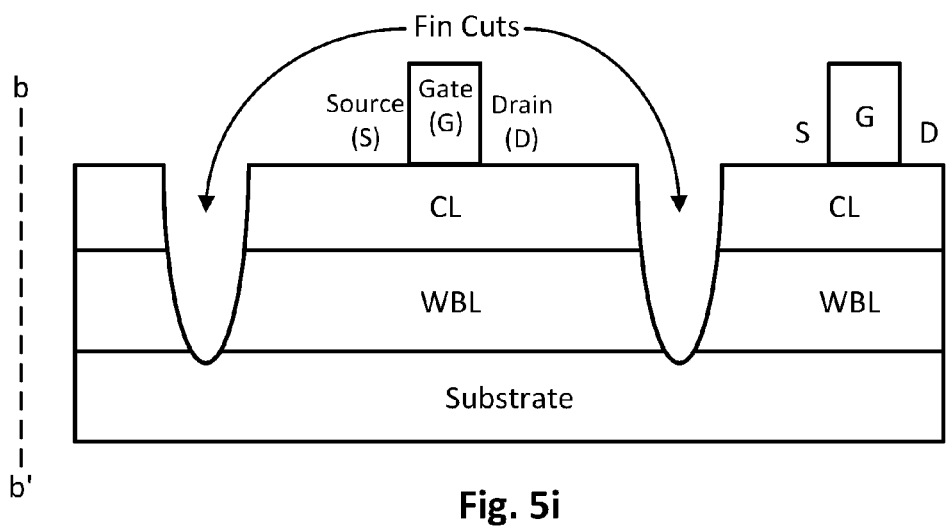

The method of FIG. 1*b* can continue with forming 114 one or more MOS transistors on the resulting structure shown in FIG. 5*h*. For example, rotating the structure shown in FIG. 5*h* by 90 degrees to show the portion of the structure along line b-b', finned MOS transistor structures (including a gate, source and drain) can subsequently be formed on the channel stacks as shown in FIG. 5*i*. However, the MOS transistor structures can also be planar or nanowire/nanoribbon structures, based on the configuration of the channel stack structure and/or based on the STI recess depth. As previously described, the structure may include the integration of p-channel transistors by excluding portions of the group IV substrate or double processing with masking layers to create subsets of III-V channel stacks and group IV channel stacks, for example, and therefore, c-MOS integration can be achieved.

As will be appreciated, the methodology illustrated in FIGS. 1a-b and described herein can be carried out using any suitable standard semiconductor processes, including lithography, chemical vapor deposition (CVD), atomic layer deposition (ALD), spin-on deposition (SOD), physical vapor deposition (PVD), wet and dry etching. As will be further appreciated in light of this disclosure, any number of suitable materials, layer geometries, and formation processes can be used to implement an embodiment of the present disclosure, so as to provide a low leakage current device or structure as described herein. As will be further appreciated, other additional preliminary, intermediate, and/or subsequent structures and processing not reflected in FIGS. 2a-c, 3a-f, 4a-f, and 5a-i may be included (e.g., such as additional patterning, cleaning, polishing/planarization processes, etc.).

Numerous variations on this methodology will be apparent in light of this disclosure. Considerations for such variations and alternative embodiments may generally include fabricating an aperture for access to reveal a region for oxidation underneath a semiconductor body or fin. In some examples cases, access to a region under a fin may be provided by a replacement gate process or a trench contact process, or both. For example, conversion after opening the gate electrode in a replacement gate process may be achieved when the channel region below the sacrificial poly is exposed. In such cases, there may be an opportunity to expose the channel region to the conversion gas (oxidizing, nitriding, or other) thereby converting the wide bandgap layer to insulator and leaving the channel layer material relatively intact. Unwanted insulator from the channel region prior to gate oxide deposition may then be cleaned off.

Example System

Figure 6:
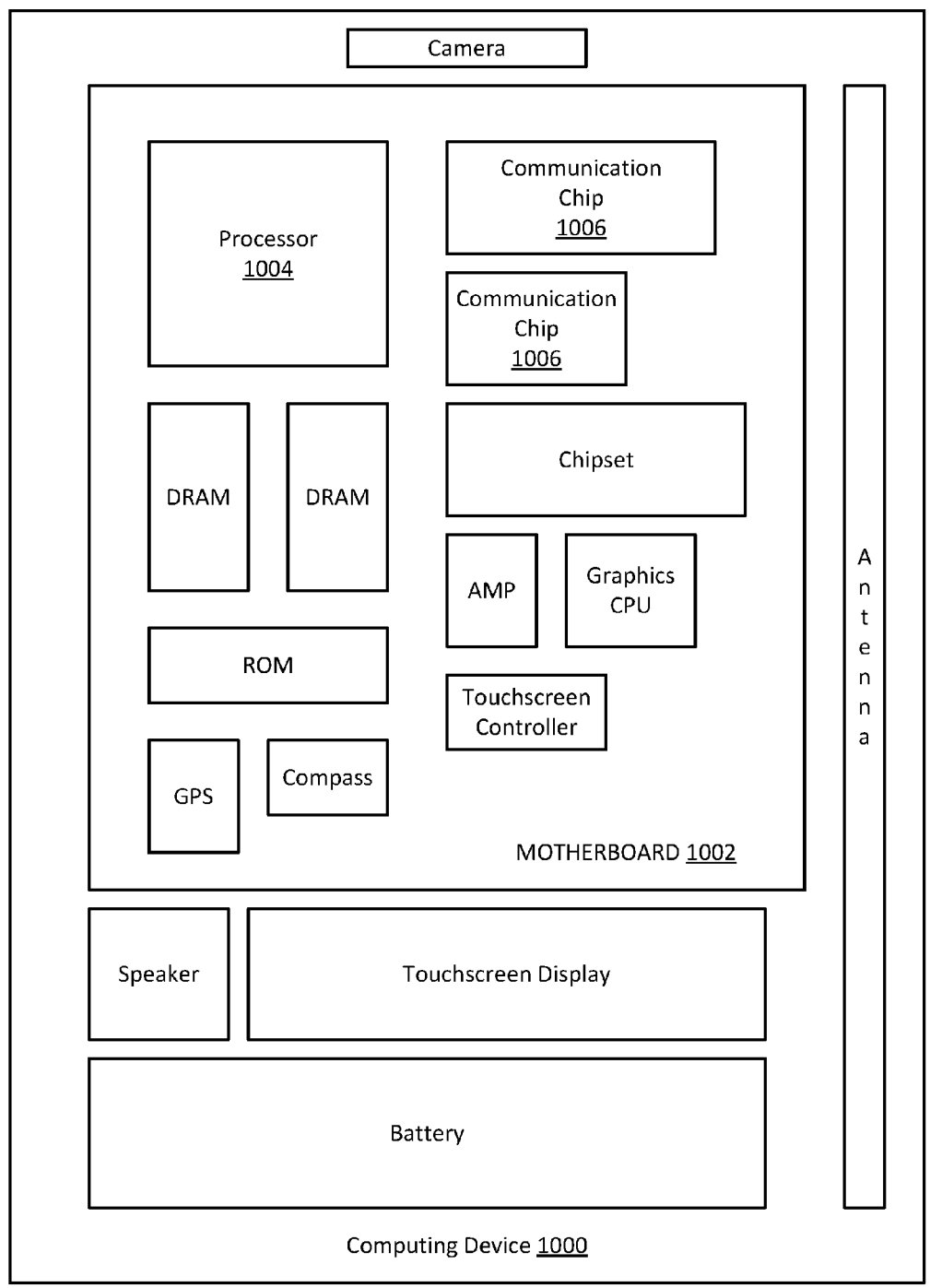
FIG. 6 illustrates a computing system implemented with one or more integrated transistor structures configured in accordance with an embodiment of the present disclosure.

FIG. 6 illustrates a computing system implemented with one or more integrated circuit structures configured in accordance with an embodiment of the present disclosure. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more transistor structures as variously described herein (e.g., a transistor configured with a high resistance layer under the channel layer). In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor 1004 may include a high resistance layer under a III-V channel, as variously described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes one or more devices implemented with one or more transistor structures as variously described herein (e.g., a transistor configured with a high resistance layer under the channel layer) as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein. In various implementations, the computing system 1000 may be a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs one or more transistor devices as variously described herein.

Further Example Embodiments

The following examples pertain to further embodiments, from which numerous permutations and configurations will be apparent.

Example 1 is a semiconductor device, comprising: a group IV substrate; a III-V channel layer having a bandgap and one or more transistor channel regions; and a high resistance layer sandwiched between the channel layer and the substrate, wherein the high resistance layer has a bandgap greater than 1.4 electron volts (eV) and that is greater than the bandgap of the channel layer.

Example 2 includes the subject matter of Example 1, wherein the high resistance layer comprises one of indium aluminum arsenide (InAlAs), indium aluminum phosphide (InAlP), aluminum phosphide (AlP), aluminum antimonide (AlSb), aluminum arsenide (AlAs), gallium indium phosphide (GaInP), gallium phosphide (GaP), and indium phosphide (InP).

Example 3 includes the subject matter of Example 1 or 2, wherein the channel layer comprises one of indium antimonide (InSb), indium gallium arsenide (InGaAs), gallium arsenide (GaAs), and indium arsenide (InAs).

Example 4 includes the subject matter of any of Examples 1-3, wherein the channel layer comprises indium gallium arsenide (InGaAs) and the high resistance layer comprises indium aluminum arsenide (InAlAs).

Example 5 includes the subject matter of any of Examples 1-3, wherein the channel layer comprises indium gallium arsenide (InGaAs) and the high resistance layer comprises gallium phosphide (GaP).

Example 6 includes the subject matter of any of Examples 1-3 wherein the channel layer comprises gallium arsenide (GaAs) and the high resistance layer comprises indium aluminum phosphide (InAlP).

Example 7 includes the subject matter of any of Examples 1-3, wherein the channel layer comprises gallium arsenide (GaAs) and the high resistance layer comprises aluminum arsenide (AlAs).

Example 8 includes the subject matter of any of Examples 1-3 wherein the channel layer comprises gallium arsenide (GaAs) and the high resistance layer comprises gallium indium phosphide (GaInP).

Example 9 includes the subject matter of any of Examples 1-3, wherein the channel layer comprises indium arsenide (InAs) and the high resistance layer comprises aluminum antimonide (AlSb).

Example 10 includes the subject matter of any of the preceding Examples, wherein the channel layer bandgap is at least 0.4 eV lower than the bandgap of the high resistance layer.

Example 11 includes the subject matter of any of the preceding Examples, wherein the high resistance layer has a bandgap greater than 2.0 eV and the channel layer has a bandgap at or below 1.4 eV.

Example 12 includes the subject matter of any of the preceding Examples, wherein the high resistance layer comprises a III-V wide bandgap material.

Example 13 includes the subject matter of Example 1 or 12, wherein the high resistance layer is nearly lattice matched with the channel layer.

Example 14 includes the subject matter of Example 1, wherein the high resistance layer includes nitrogen.

Example 15 includes the subject matter of Example 1, wherein the high resistance layer is at least partially comprised of an insulator material.

Example 16 includes the subject matter of Example 1, wherein the high resistance layer includes an electrically insulating oxide material.

Example 17 includes the subject matter of any of the preceding Examples, wherein each of the high resistance layer and the channel layer is less than 5000 angstroms (Å) thick.

Example 18 includes the subject matter of any of the preceding Examples, wherein each of the high resistance layer and the channel layer is less than 1500 angstroms (Å) thick.

Example 19 includes the subject matter of any of the preceding Examples, wherein the one or more channel regions are n-type channel regions.

Example 20 includes the subject matter of Example 19, further comprising p-type channel regions for complementary metal-oxide-semiconductor (c-MOS) devices.

Example 21 includes the subject matter of any of the preceding Examples, wherein one or more transistor devices are formed on and/or in the III-V channel layer with a fin-based, planar, nanowire, or nanoribbon architecture.

Example 22 is an integrated circuit comprising the device of any of the preceding Examples.

Example 23 is a mobile computing system comprising the device of any of the preceding Examples 1 through 21, or the integrated circuit of Example 22.

Example 24 is a semiconductor device, comprising: a group IV substrate; a III-V channel layer having a bandgap of 1.4 eV or less and one or more metal-oxide-semiconductor (MOS) transistor devices; and a high resistance layer sandwiched between the channel layer and the substrate, wherein the high resistance layer has a bandgap that is at least 0.4 electron volts (eV) greater than the channel layer bandgap.

Example 25 includes the subject matter of Example 24, wherein the high resistance layer comprises a III-V wide bandgap material.

Example 26 includes the subject matter of Example 24, wherein the high resistance layer comprises a III-V wide bandgap material that is at least partially converted to an insulator material.

Example 27 includes the subject matter of Example 26, wherein the insulator material portion of the high resistance layer includes an oxide material.

Example 28 is a method for forming a semiconductor device, comprising: depositing a III-V wide bandgap layer having a bandgap greater than 1.4 electron volts (eV) on and/or in at least a portion of a group IV substrate; depositing a III-V channel layer over the wide bandgap layer; and forming one or more transistor devices on at least a portion of the channel layer.

Example 29 includes the subject matter of Example 28, wherein the III-V layers are blanket deposited over at least a portion of the substrate to form a IV/III-V/III-V structure.

Example 30 includes the subject matter of Example 29, further comprising: etching one or more trenches in the IV/III-V/III-V structure; and depositing a shallow trench isolation (STI) material in at least one of the trenches.

Example 31 includes the subject matter of Example 29, further comprising: etching one or more trenches in the IV/III-V/III-V structure; and converting the wide bandgap layer at least partially to an insulator.

Example 32 includes the subject matter of Example 28, wherein the III-V layers are selectively deposited in one or more trenches formed in the substrate prior to depositing the III-V layers.

Example 33 includes the subject matter of Example 32, further comprising: selectively depositing the III-V layers in trenches located next to removable material previously deposited in the substrate; removing the removable material to expose at least a portion of the wide bandgap layer; and converting the wide bandgap layer at least partially to an insulator.

Example 34 includes the subject matter of Example 31 or 33, wherein the conversion is achieved through exposing the wide bandgap layer to an oxidizing and/or nitriding environment.

Example 35 includes the subject matter of Example 34, wherein the channel layer is hardmasked prior to converting the wide bandgap layer at least partially to an insulator.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously or otherwise demonstrated disclosed herein.

What is claimed is:

1. An integrated circuit (IC) comprising:
   a substrate including group IV semiconductor material;
   a fin above the substrate and in a trench in the substrate, the trench in the substrate including a curved bottom, the fin including
      a channel layer including group III-V semiconductor material, the group III-V semiconductor material having a first bandgap, wherein a transistor channel region is included in the channel layer, and
      a high resistance layer between the channel layer and the substrate, the high resistance layer having a curved bottom portion conformal to the curved bottom of the trench in the substrate, wherein material included in the high resistance layer has a second bandgap greater than 1.4 electron volts (eV) and greater than the first bandgap;
   a gate above the transistor channel region;
   a first set of trenches adjacent a first set of two opposing sides of the fin; and
   a second set of trenches adjacent a second set of two opposing sides of the fin;
   wherein the high resistance layer includes a thickness between the channel layer and the substrate of less than 5000 angstroms (Å).

2. The IC of claim 1 wherein the high resistance layer includes one of indium aluminum arsenide (InAlAs), indium aluminum phosphide (InAlP), aluminum phosphide (AlP), aluminum antimonide (AlSb), aluminum arsenide (AlAs), gallium indium phosphide (GaInP), gallium phosphide (GaP), and indium phosphide (InP).

3. The IC of either claim 2 wherein the channel layer includes one of indium antimonide (InSb), indium gallium arsenide (InGaAs), gallium arsenide (GaAs), and indium arsenide (InAs).

4. The IC of claim 1 wherein the channel layer includes indium gallium arsenide (InGaAs) and the high resistance layer includes indium aluminum arsenide (InAlAs).

5. The IC of claim 1 wherein the channel layer includes indium gallium arsenide (InGaAs) and the high resistance layer includes gallium phosphide (GaP).

6. The IC of claim 1 wherein the channel layer includes gallium arsenide (GaAs) and the high resistance layer includes indium aluminum phosphide (InAlP).

7. The IC of claim 1 wherein the channel layer includes gallium arsenide (GaAs) and the high resistance layer includes aluminum arsenide (AlAs).

8. The IC of claim 1 wherein the channel layer includes gallium arsenide (GaAs) and the high resistance layer includes gallium indium phosphide (GaInP).

9. The IC of claim 1 wherein the channel layer includes indium arsenide (InAs) and the high resistance layer includes aluminum antimonide (AlSb).

10. The IC of claim 1 wherein the first bandgap is at least 0.4 eV lower than the second bandgap.

11. The IC of claim 1 wherein the second bandgap is greater than 2.0 eV and the first bandgap is equal to or less than 1.4 eV.

12. The IC of claim 1 wherein the high resistance layer includes group III-V semiconductor material.

13. The IC of claim 1 wherein the high resistance layer includes nitrogen.

14. The IC of claim 1 wherein the channel layer is less than 1500 angstroms (Å) thick.

15. The IC of claim 1 wherein the transistor includes at least one of a fin-based, nanowire, and nanoribbon architecture.

16. A mobile computing system comprising a housing, wherein the IC of claim 1 is included in the housing.

17. The IC of claim 1, further comprising insulator material in the first and second set of trenches.

18. An integrated circuit (IC), comprising:
    a substrate including group IV semiconductor material;
    a fin above the substrate and in a trench in the substrate, the trench in the substrate including a curved bottom, the fin including
       a channel layer including group III-V semiconductor material, the group III-V semiconductor material having a first bandgap of 1.4 electron volts (eV) or less, wherein a transistor channel region is included in the channel layer, and
       a high resistance layer between the channel layer and the substrate, the high resistance layer having a curved bottom portion conformal to the curved bottom of the trench in the substrate, wherein material included in the high resistance layer has a second bandgap that is at least 0.4 eV greater than the first bandgap;
    a gate above the transistor channel region;
    a first set of trenches adjacent a first set of two opposing sides of the fin; and
    a second set of trenches adjacent a second set of two opposing sides of the fin.

19. The IC of claim 18, further comprising insulator material in the first and second set of trenches.

* * * * *